United States Patent
Hudgens

(10) Patent No.: US 7,688,017 B2
(45) Date of Patent: Mar. 30, 2010

(54) MULTI-AXIS VACUUM MOTOR ASSEMBLY

(75) Inventor: Jeffrey C. Hudgens, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/352,004

(22) Filed: Feb. 11, 2006

(65) Prior Publication Data

US 2006/0245905 A1 Nov. 2, 2006

Related U.S. Application Data

(60) Provisional application No. 60/652,145, filed on Feb. 12, 2005.

(51) Int. Cl.
*B25J 9/18* (2006.01)
(52) U.S. Cl. .............. 318/568.11; 318/538; 310/112; 310/114; 310/152; 310/154.33
(58) Field of Classification Search .......... 318/575, 318/538, 568.11, 568.12; 310/112, 114, 310/152, 154.01, 154.06, 154.33; 414/744.1
See application file for complete search history.

(56) References Cited

U.S. PATENT DOCUMENTS

| | | | | |
|---|---|---|---|---|
| 4,829,840 A | * | 5/1989 | Torii et al. ............... | 74/490.03 |
| 5,020,475 A | * | 6/1991 | Crabb et al. ............... | 118/719 |
| 5,065,060 A | | 11/1991 | Takahashi et al. | |
| 5,270,600 A | * | 12/1993 | Hashimoto ............... | 310/75 D |
| 5,331,819 A | | 7/1994 | Matsuda et al. | |
| 5,397,212 A | * | 3/1995 | Watanabe et al. ........ | 414/744.6 |
| 5,544,411 A | | 8/1996 | Kano et al. | |
| 5,720,590 A | * | 2/1998 | Hofmeister ............... | 414/744.2 |
| 5,760,508 A | | 6/1998 | Jennings et al. | |

(Continued)

FOREIGN PATENT DOCUMENTS

JP 11215780 * 6/1999

(Continued)

OTHER PUBLICATIONS

Office Action of Chinese Application No. 200680000204.9 (7781-CHI) mailed Dec. 12, 2008.

(Continued)

*Primary Examiner*—Bentsu Ro
*Assistant Examiner*—Antony M Paul
(74) *Attorney, Agent, or Firm*—Dugan & Dugan PC

(57) ABSTRACT

In at least one aspect, a second multi-axis vacuum motor assembly is provided. The second multi-axis vacuum motor assembly includes (1) a first rotor; (2) a first stator adapted to commutate so as to rotate the first rotor across a vacuum barrier and control rotation of a first axis of a robot arm within a vacuum chamber; (3) a second rotor below the first rotor; (4) a second stator below the first stator and adapted to commutate so as to rotate the second rotor across the vacuum barrier and control rotation of a second axis of the robot arm within the vacuum chamber; (5) a first feedback device adapted to monitor rotation of the first axis of the robot arm; and (6) a second feedback device adapted to monitor rotation of the second axis of the robot arm. Numerous other aspects are provided.

21 Claims, 2 Drawing Sheets

U.S. PATENT DOCUMENTS

| | | | |
|---|---|---|---|
| 5,770,936 A * | 6/1998 | Hirai et al. | 318/538 |
| 5,813,823 A * | 9/1998 | Hofmeister | 414/744.5 |
| 5,899,658 A * | 5/1999 | Hofmeister | 414/744.5 |
| 5,914,548 A * | 6/1999 | Watanabe et al. | 310/88 |
| 6,057,662 A * | 5/2000 | McAndrew et al. | 318/567 |
| 6,102,164 A * | 8/2000 | McClintock et al. | 187/267 |
| 6,150,742 A | 11/2000 | Horner et al. | |
| 6,189,404 B1 * | 2/2001 | Hatake et al. | 74/490.03 |
| 6,274,875 B1 | 8/2001 | Smick et al. | |
| 6,355,999 B1 * | 3/2002 | Kichiji et al. | 310/112 |
| 6,363,808 B1 * | 4/2002 | Wakabayashi et al. | 74/490.03 |
| 6,485,250 B2 * | 11/2002 | Hofmeister | 414/744.1 |
| 6,543,306 B1 * | 4/2003 | Wakabayashi et al. | 74/490.03 |
| 6,799,939 B2 * | 10/2004 | Lowrance et al. | 414/814 |
| 6,800,833 B2 * | 10/2004 | Gregor et al. | 219/390 |
| 7,336,012 B2 * | 2/2008 | Tanaka | 310/112 |
| 2002/0094600 A1 * | 7/2002 | Aburatani et al. | 438/100 |
| 2005/0118009 A1 * | 6/2005 | van der Meulen | 414/744.1 |
| 2007/0116549 A1 | 5/2007 | Rice et al. | |
| 2008/0063504 A1 | 3/2008 | Kroetz et al. | |
| 2008/0298945 A1 | 12/2008 | Cox et al. | |

FOREIGN PATENT DOCUMENTS

| | | |
|---|---|---|
| JP | 2000-069741 | 3/2000 |
| JP | 2000069741 | 3/2000 |
| WO | WO 2006/088757 | 8/2006 |

OTHER PUBLICATIONS

International Preliminary Report on Patentability and Written Opinion of International Application No. PCT/US2006/004871 (7781/PCT) issued on Aug. 23, 2007.

International Search Report and Written Opinion of International Application No. PCT/US2006/004871 (7781/PCT) mailed on Jun. 27, 2006.

Second Office Action of Chinese Application No. 200680000204.9 (7781-PCT-CHI) mailed Jun. 5, 2009.

* cited by examiner

MULTI-AXIS VACUUM MOTOR ASSEMBLY

The present application claims priority from U.S. Provisional Patent Application Ser. No. 60/652,145, filed Feb. 12, 2005, which is hereby incorporated by reference herein in its entirety.

FIELD OF THE INVENTION

The present invention relates to semiconductor device manufacturing, and more particularly to a multi-axis motor assembly for use with a wafer handler.

BACKGROUND OF THE INVENTION

In the manufacture of semiconductor devices, such as integrated circuits (ICs), dynamic random access memories (DRAMs), etc., large thin wafers (typically of silicon) from which the semiconductor devices are fabricated must frequently be transferred from one processing chamber to another. This transfer of wafers must be carried out in a clean environment and often at sub-atmospheric pressures. To this end various mechanical arrangements have been devised for transferring wafers to and from processing chambers in a piece of equipment or from one piece of equipment to another.

It is the usual practice to load wafers into a cassette so that a number of wafers can be carried under clean-room conditions safely and efficiently from one place to another. A cassette loaded with wafers may then be inserted into an input/output (I/O) chamber ("load lock" chamber) where a desired gas pressure and atmosphere can be established. The wafers are fed one-by-one to or from their respective cassettes into or out of the I/O chamber.

It is desirable from the standpoint of efficiency in handling of the wafers that the I/O chamber be located in close proximity to a number of processing chambers to permit more than one wafer to be processed nearby and at the same time. To this end two or more chambers are arranged at locations on the periphery of a transfer chamber which is hermetically sealable and which communicates with both the I/O chamber and the processing chambers. Located within the transfer chamber is an automatically controlled wafer handling mechanism, or robot, which takes wafers supplied from the I/O chamber and then transfers each wafer into a selected processing chamber. After processing in one chamber a wafer is withdrawn from the chamber by the robot and inserted into another processing chamber, or returned to the I/O chamber and ultimately a respective cassette.

Semiconductor wafers are by their nature fragile and easily chipped or scratched. Therefore they are handled with great care to prevent damage. The robot mechanism which handles a wafer holds it securely, yet without scratching a surface or chipping an edge of the brittle wafers. The robot moves the wafer smoothly without vibration or sudden stops or jerks. Vibration of the robot can cause abrasion between a robot blade holding a wafer and a surface of the wafer. The "dust" or abraded particles of the wafer caused by such vibration can in turn cause surface contamination of other wafers. As a result, the design of a robot requires careful measures to insure that the movable parts of the robot operate smoothly without lost motion or play, with the requisite gentleness in holding a wafer, yet be able to move the wafer quickly and accurately between locations.

Because of space constraints under and/or within a transfer chamber, it is desirable to reduce the height of the motor assembly employed to drive a robot. It is also desirable to provide a robot able to independently handle multiple wafers so as to increase the through-put of a wafer-processing apparatus.

SUMMARY OF THE INVENTION

In a first aspect of the invention, a first multi-axis vacuum motor assembly is provided. The first multi-axis vacuum motor assembly includes (1) a first rotor; (2) a first stator adapted to magnetically couple with the first rotor across a vacuum barrier so as to control rotation of a first axis of a robot arm within a vacuum chamber; (3) a second rotor below the first rotor; (4) a second stator below the first stator and adapted to magnetically couple with the second rotor across the vacuum barrier so as to control rotation of a second axis of the robot arm within the vacuum chamber; (5) a first feedback device located on an atmospheric side of the vacuum barrier and adapted to monitor rotation of the first axis of the robot arm via passive magnetic coupling across the vacuum barrier; and (6) a second feedback device located on the atmospheric side of the vacuum barrier and adapted to monitor rotation of the second axis of the robot arm via passive magnetic coupling across the vacuum barrier.

In a second aspect of the invention, a second multi-axis vacuum motor assembly is provided. The second multi-axis vacuum motor assembly includes (1) a first rotor; (2) a first stator adapted to commutate so as to rotate the first rotor across a vacuum barrier and control rotation of a first axis of a robot arm within a vacuum chamber; (3) a second rotor below the first rotor; (4) a second stator below the first stator and adapted to commutate so as to rotate the second rotor across the vacuum barrier and control rotation of a second axis of the robot arm within the vacuum chamber; (5) a first feedback device adapted to monitor rotation of the first axis of the robot arm; and (6) a second feedback device adapted to monitor rotation of the second axis of the robot arm.

Numerous other aspects are provided, including methods of operating a robot arm using the first and second multi-axis vacuum motor assemblies. Other features and aspects of the present invention will become more fully apparent from the following detailed description, the appended claims and the accompanying drawings.

DETAILED DESCRIPTION

Disclosed is a multi-axis motor assembly for use in a transfer or other chamber. The improved design allows feedback devices and/or motor elements to be nested so as to reduce stack height below the transfer chamber. Additionally, sensing functions need not be transmitted across a vacuum barrier.

Figure 1:
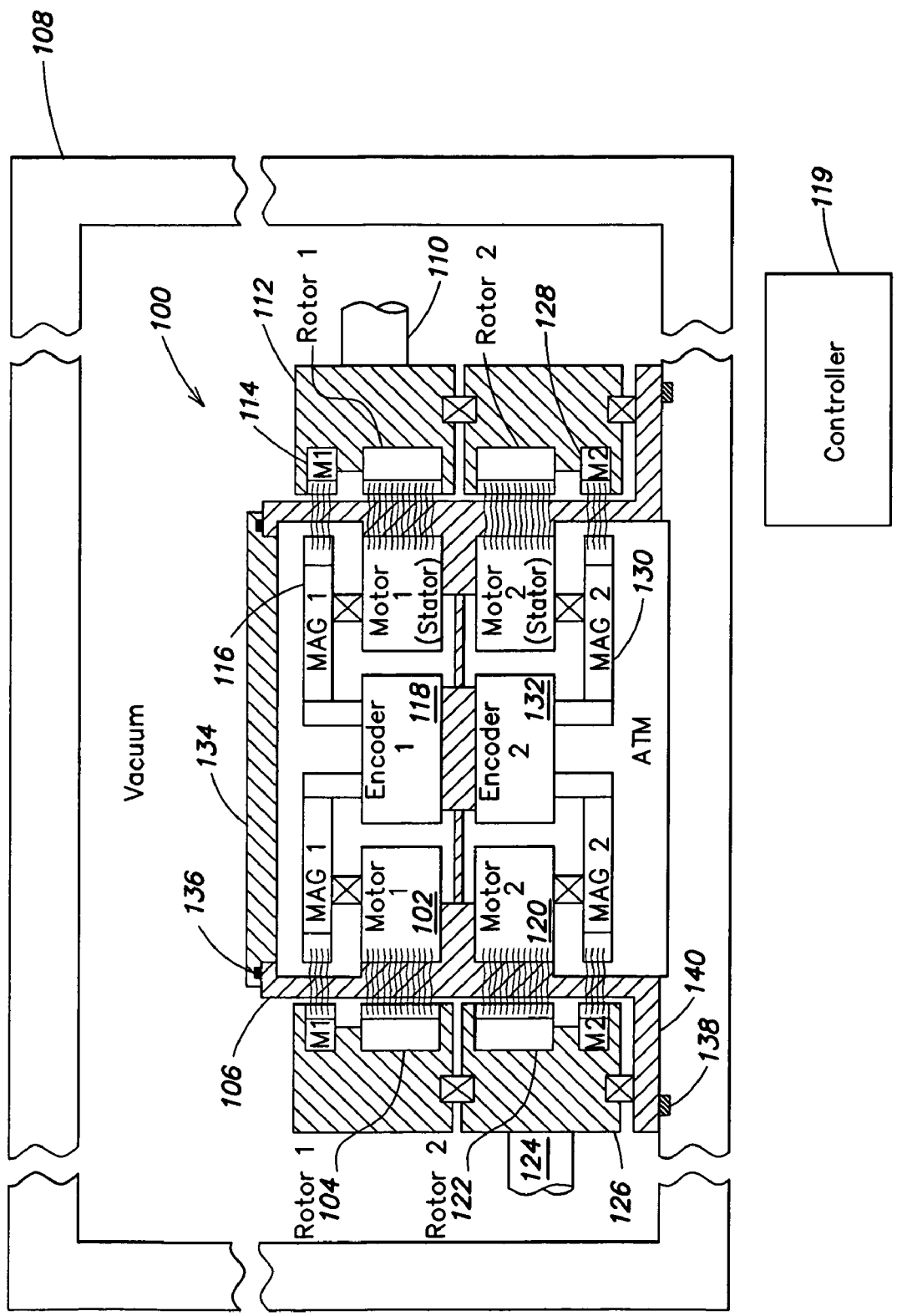
FIG. 1 is a cross-sectional view of a first exemplary multi-axis vacuum motor assembly provided in accordance with the present invention.
Figure 2:
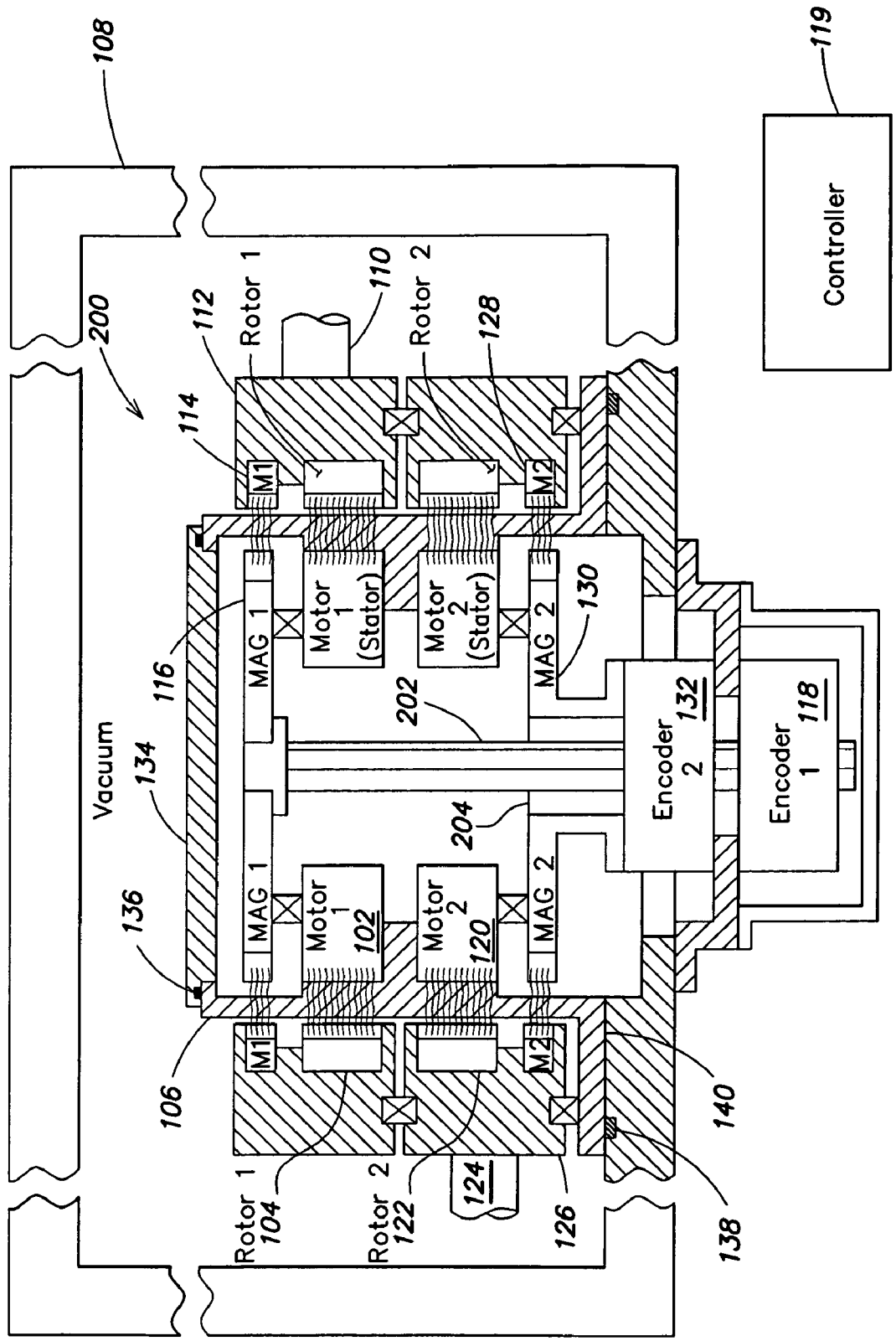
FIG. 2 is a cross-sectional view of a second exemplary multi-axis vacuum motor assembly provided in accordance with the present invention.

FIG. 1 is a cross-sectional view of a first exemplary multi-axis vacuum motor assembly 100 provided in accordance with the present invention. As will be described below, the first multi-axis motor assembly 100 utilizes magnetic coupling across a vacuum barrier to drive a robot in a vacuum chamber. Feedback devices and motor elements are nested for vertical compactness and reside outside of the vacuum chamber. As shown in FIGS. 1 and 2, vertical compactness is depicted in that the multi-axis motor assemblies have reduced heights, such as relatives to their widths.

The first multi-axis vacuum motor assembly 100 of FIG. 1 includes a first stator 102 (Motor 1 (stator)) for driving a first rotor 104 (Rotor 1) across a vacuum barrier 106 of a vacuum chamber 108. The first stator 102 may act as an active magnetic coupling to drive the first rotor 104. That is, commutation of the first stator 102 (e.g., via appropriate application of a current to windings of the stator) controls rotation of the first rotor 104 across the vacuum barrier 106.

The first stator 102 may be affixed to the vacuum barrier 106 on the atmospheric side. In one embodiment, the first stator 102 is stationary and may be affixed to the vacuum barrier 106 such that there is no air gap between the first stator 102 and the vacuum barrier 106, allowing for maximum magnetic efficiency. Other configurations may be employed.

The first rotor-stator pair 102, 104 may, for example, comprise a portion of a conventional brushless DC motor or any suitable motor configuration.

The first rotor 104 is coupled to a first axis of a robot arm 110 via a first hub 112 (e.g., of a frog-leg or other robot). Also coupled to the first hub 112 is a first passive rotary magnetic coupling 114 (M1). The first rotary magnetic coupling 114 is magnetically coupled to a second passive rotary magnetic coupling 116 (Mag 1) across the vacuum barrier 106. The second rotary magnetic coupling 116 is coupled to a first feedback device 118 (Encoder 1). As this feedback device is outside of the vacuum chamber 108, at atmosphere, there is little restriction as to the device technology available for use as the feedback device 118. For example, the feedback device 118 may be a resolver, an optical encoder, a magnetic encoder, or any other appropriate device (e.g., useful for positioning and/or commutating a vacuum robot).

The first feedback device 118 is coupled to and may communicate positional information about the first robot arm 110 to a controller 119 that is adapted to control operation of a robot (not separately shown) that is driven by the multi-axis vacuum motor assembly 100. For example, the first feedback device 118 may be hardwired to or communicate wirelessly with the controller 119.

Nested with the motor elements and feedback device described above is a second feedback device, motor stator drive, and magnetic coupling system. As shown in FIG. 1, the first exemplary multi-axis vacuum motor assembly 100 includes a second stator 120 (Motor 2 (stator)) that may be a motor stator for driving a second rotor 122 (Rotor 2) across the vacuum barrier 106. The second stator 120 may act as an active magnetic coupling to drive the second rotor 122. That is, commutation of the second stator 120 (e.g., via appropriate application of a current to windings of the stator) controls rotation of the second rotor 122 across the vacuum barrier 106.

The second stator 120 may be affixed to the vacuum barrier 106 on the atmospheric side. In one embodiment, the second stator 120 is stationary and may be affixed to the vacuum barrier 106 such that there is no air gap between the second stator 120 and the vacuum barrier 106, allowing for maximum magnetic efficiency. Other configurations may be employed.

The second rotor-stator pair 120, 122 may, for example, comprise a portion of a conventional brushless DC motor or any suitable motor configuration.

The second rotor 122 may be coupled to a second axis of a robot arm 124 via a second hub 126 (e.g., of a frog-leg or other robot). Also coupled to the second hub 126 may be a third passive rotary magnetic coupling 128 (M2). The third rotary magnetic coupling 128 is magnetically coupled to a fourth passive rotary magnetic coupling 130 (Mag 2) across the vacuum barrier 106. The third rotary magnetic coupling 128 is coupled to a second feedback device 132 (Encoder 2). As with the first feedback device 118, the second feedback device 132 may be a resolver, an optical encoder, a magnetic encoder, or any other appropriate feedback device.

The second feedback device 132 is coupled to and may communicate positional information about the second robot arm 124 to the controller 119 that is adapted to control operation of a robot (not separately shown) that is driven by the multi-axis vacuum motor assembly 100. For example, the second feedback device 132 may be hardwired to or communicate wirelessly with the controller 119. In a hardwired embodiment, the first and/or second feedback devices 118, 132 may include a hollow bore that allows wires to pass to the controller 119 or any other suitable location.

Note that bearings may be provided between components that move and/or rotate relative to one another. For example, as shown in FIG. 1, bearings may be provided between the first stator 102 and the second rotary magnetic coupling 116, between the second stator 120 and the fourth rotary magnetic coupling 130, between the first hub 112 and the second hub 126, between the second hub 126 and an outer housing 140 of the multi-axis vacuum motor assembly 100, etc.

As further shown in FIG. 1, the multi-axis vacuum motor assembly 100 may include a cover or lid 134 that may be removed to gain access to various components within the multi-axis vacuum motor assembly 100. The cover 134 may be vacuum sealed using an appropriate sealing member 136, such as an o-ring. A sealing member 138 similarly may be used to seal the outer housing 140 of the multi-axis vacuum motor assembly 100 relative to the vacuum chamber 108.

FIG. 2 is a cross-sectional view of a second exemplary multi-axis vacuum motor assembly 200 provided in accordance with the present invention. The second multi-axis vacuum motor assembly 200 is similar to the first multi-axis vacuum motor assembly 100. However, in the second multi-axis vacuum motor assembly 200, the second passive rotary magnetic coupling 116 (Mag 1) is coupled to the first feedback device 118 via a first rotary shaft 202; and the fourth passive rotary magnetic coupling 130 (Mag 2) is coupled to the second feedback device 132 via a second rotary shaft 204.

In the embodiment shown, the first rotary shaft 202 and second rotary shaft 204 are coaxial (although other configurations may be used). That is, in this exemplary diagram, the first rotary shaft 202 is contained within the second rotary shaft 204. This design allows for a similar compactness to the first multi-axis motor assembly 100 of FIG. 1. However, the first and second feedback devices 118, 132 may be located below the motor elements. In such an embodiment, the first and/or second feedback devices 118, 132 may include a hollow bore (not shown) through which the shaft 202 and/or 204 may extend.

The multi-axis vacuum motor assemblies of the present invention provide for a more compact design that may reduce space required under or within a transfer chamber (vacuum chamber 108). In particular, the space required under a transfer chamber is reduced by the vertical compactness of the present invention, as mentioned above. Vertical compactness is synonymous with reduced height, and the height of an assembly correlates to the height of its components. Vertical compactness does not require horizontal compactness, however, so an assembly, and by extension, at least a portion of its components, may have a reduced height, but a non-reduced width. For instance, as depicted in FIGS. 1 and 2, first hub 112 has a reduced height that is less than half of its width. Likewise, and stated another way, second hub 126 has a width that is more than twice the height of second hub 126. Additionally, sensing functions do not have to be transmitted across the vacuum barrier 106. Rather, the present invention may utilize magnetic coupling principles to bring the angular position of the first rotor 104 and/or second rotor 122 to the atmospheric side of the vacuum barrier 106 and to the feedback devices 118, 132 located outside the vacuum chamber 108.

Note that any number of coaxial axes may be employed (e.g., such as four axes separated by a spool piece or the like). For example, the multi-axis vacuum motor assembly 100 and/or 200 may be used with the multi-wafer handling robots disclosed in U.S. Pat. Nos. 6,379,095 and 6,582,175 which are hereby incorporated by reference herein in their entirety (e.g., multi-wafer handling robots that may transfer two, four or more substrates at a time).

Further, the rotor-stator positions shown in FIG. 1 and/or FIG. 2 may be reversed (e.g., such that the rotors 104, 122 are positioned outside of the vacuum chamber 108 and the robot arms are driven by the rotors).

Through use of the multi-axis vacuum motor assembly 100 and/or 200, a robot such as a frog-leg robot, a SCARA robot, etc., may be controlled. For example, by employing the first stator and the second stator to rotate the first axis and second axis of a robot arm, the robot arm may be extended, retracted and/or rotated. More specifically, commutating the first stator and the second stator causes the first axis and second axis of the robot arm to rotate so as to extend, retract and/or rotate the robot arm.

Accordingly, while the present invention has been disclosed in connection with exemplary embodiments thereof, it should be understood that other embodiments may fall within the spirit and scope of the invention, as defined by the following claims.

The invention claimed is:

1. A multi-axis vacuum motor assembly comprising:
   a first rotor;
   a first stator adapted to magnetically couple with the first rotor across a vacuum barrier so as to control rotation of a first axis of a robot arm within a vacuum chamber;
   a second rotor below the first rotor;
   a second stator below the first stator and adapted to magnetically couple with the second rotor across the vacuum barrier so as to control rotation of a second axis of the robot arm within the vacuum chamber;
   a first feedback device located on an atmospheric side of the vacuum barrier, nested with the first stator and adapted to monitor rotation of the first axis of the robot arm via a first passive magnetic coupling across the vacuum barrier, the first passive magnetic coupling including a first passive rotary magnetic coupling within the vacuum chamber and a second passive rotary magnetic coupling coupled to the first feedback device; and
   a second feedback device located on the atmospheric side of the vacuum barrier, nested with the second stator and adapted to monitor rotation of the second axis of the robot arm via a second passive magnetic coupling across the vacuum barrier, the second passive magnetic coupling including a third passive rotary magnetic coupling within the vacuum chamber and a fourth passive rotary magnetic coupling coupled to the second feedback device.

2. The multi-axis vacuum motor assembly of claim 1 wherein the first and second stators are located on the atmospheric side of the vacuum barrier.

3. The multi-axis vacuum motor assembly of claim 2 wherein the first and second stators are aligned vertically.

4. The multi-axis vacuum motor assembly of claim 2 wherein the first and second stators are directly attached to the vacuum barrier with substantially no air gap between the first and second stators and the vacuum barrier.

5. The multi-axis vacuum motor assembly of claim 1 wherein commutation of the first stator controls rotation of the first rotor across the vacuum barrier.

6. The multi-axis vacuum motor assembly of claim 1 wherein commutation of the second stator controls rotation of the second rotor across the vacuum barrier.

7. The multi-axis vacuum motor assembly of claim 1 wherein the first stator and the first rotor reside in the same horizontal plane.

8. The multi-axis vacuum motor assembly of claim 1 wherein first stator, second stator, first feedback device and second feedback device are arranged so as not to extend below a bottom of the vacuum chamber.

9. A multi-axis vacuum motor assembly comprising:
   a first rotor;
   a first stator adapted to commutate so as to rotate the first rotor across a vacuum barrier and control rotation of a first axis of a robot arm within a vacuum chamber;
   a second rotor below the first rotor;
   a second stator below the first stator and adapted to commutate so as to rotate the second rotor across the vacuum barrier and control rotation of a second axis of the robot arm within the vacuum chamber;
   a first passive rotary magnetic coupling;
   a second passive rotary magnetic coupling magnetically coupled to the first passive rotary magnetic coupling across the vacuum barrier;
   a first feedback device nested with the first stator and adapted to monitor rotation of the first axis of the robot arm, the first feedback device coupled to the second passive rotary magnetic coupling;
   a third passive rotary magnetic coupling;
   a fourth passive rotary magnetic coupling magnetically coupled to the third passive rotary magnetic coupling across the vacuum barrier; and
   a second feedback device nested with the second stator and adapted to monitor rotation of the second axis of the robot arm, the second feedback device coupled to the fourth passive rotary magnetic coupling.

10. The multi-axis vacuum motor assembly of claim 9 wherein the first and second stators are located on the atmospheric side of the vacuum barrier.

11. The multi-axis vacuum motor assembly of claim 9 wherein the first and second stators are aligned vertically.

12. The multi-axis vacuum motor assembly of claim 9 wherein the first and second stators are directly attached to the vacuum barrier with substantially no air gap between the first and second stators and the vacuum barrier.

13. The multi-axis vacuum motor assembly of claim 9 wherein the first stator and the first rotor reside in the same horizontal plane.

14. The multi-axis vacuum motor assembly of claim 9 wherein first stator, second stator, first feedback device and second feedback device are arranged so as not to extend below a bottom of the vacuum chamber.

15. A multi-axis vacuum motor assembly comprising:
   a first rotor;
   a first stator adapted to magnetically couple with the first rotor across a vacuum barrier so as to control rotation of a first axis of a robot arm within a vacuum chamber;
   a second rotor below the first rotor;
   a second stator below the first stator and adapted to magnetically couple with the second rotor across the vacuum barrier so as to control rotation of a second axis of the robot arm within the vacuum chamber;

a first feedback device located on an atmospheric side of the vacuum chamber adapted to monitor rotation of the first axis of the robot arm via a first passive magnetic coupling across the vacuum barrier, the first passive magnetic coupling including a first passive rotary magnetic coupling within the vacuum chamber and a second passive rotary magnetic coupling on the atmospheric side coupled to the first feedback device;

a second feedback device located on an atmospheric side of the vacuum chamber adapted to monitor rotation of the second axis of the robot arm via a second passive magnetic coupling across the vacuum barrier, the second passive magnetic coupling including a third passive rotary magnetic coupling within the vacuum chamber and a fourth passive rotary magnetic coupling on the atmospheric side coupled to the second feedback device; and wherein the first stator is disposed radially inward relative to the first rotor, the first feedback device is disposed radially inward relative to the first stator, the second stator is disposed radially inward relative to the second rotor, and the second feedback device is disposed radially inward relative to the second stator.

16. A multi-axis vacuum motor assembly comprising:
a first rotor;
a first stator adapted to magnetically couple with the first rotor across a vacuum barrier so as to control rotation of a first axis of a robot arm within a vacuum chamber;
a second rotor below the first rotor;
a second stator below the first stator and adapted to magnetically couple with the second rotor across the vacuum barrier so as to control rotation of a second axis of the robot arm within the vacuum chamber;
a first feedback device adapted to monitor rotation of the first axis of the robot arm via passive magnetic coupling across the vacuum barrier; and
a second feedback device adapted to monitor rotation of the second axis of the robot arm via passive magnetic coupling across the vacuum barrier;
wherein the first stator is disposed radially inward relative to the first rotor, the first rotor is attached to a first hub, the first hub is attached to the robot arm, and a first hub minimum width is more than twice a first hub maximum height; and
wherein the second stator is disposed radially inward relative to the second rotor, the second rotor is attached to a second hub, the second hub is attached to the robot arm, and a second hub minimum width is more than twice a second hub maximum height.

17. The multi-axis vacuum motor assembly of claim 16 wherein the first hub minimum width substantially equals the second hub minimum width.

18. The multi-axis vacuum motor assembly of claim 16 wherein the first hub maximum height substantially equals the second hub maximum height.

19. The multi-axis vacuum motor assembly of claim 16 wherein the first hub minimum width is greater than the first hub maximum height plus the second hub maximum height.

20. A multi-axis vacuum motor assembly comprising:
an outer housing including a vacuum barrier and a cover, the cover being removably attachable to the vacuum barrier to form an airtight seal;
a first rotor;
a first stator adapted to magnetically couple with the first rotor across a vacuum barrier so as to control rotation of a first axis of a robot arm within a vacuum chamber;
a second rotor below the first rotor;
a second stator below the first stator and adapted to magnetically couple with the second rotor across the vacuum barrier so as to control rotation of a second axis of the robot arm within the vacuum chamber;
a first feedback device adapted to monitor rotation of the first axis of the robot arm via passive magnetic coupling across the vacuum barrier; and
a second feedback device adapted to monitor rotation of the second axis of the robot arm via passive magnetic coupling across the vacuum barrier;
wherein the first stator, the first feedback device, the second stator, and the second feedback device are disposed within the vacuum barrier;
wherein the first rotor and the second rotor are disposed outside the vacuum barrier; and
wherein the cover may be removed to gain access to the first stator, the first feedback device, the second stator, and the second feedback device.

21. The multi-axis vacuum motor assembly of claim 20 wherein the cover includes a first sealing member, and wherein the outer housing includes a second sealing member with which the outer housing may form an airtight seal when attached to a vacuum chamber.

* * * * *